(12) United States Patent
Croswell et al.

(10) Patent No.: US 7,056,800 B2
(45) Date of Patent: Jun. 6, 2006

(54) PRINTED CIRCUIT EMBEDDED CAPACITORS

(75) Inventors: Robert T. Croswell, Hanover Park, IL (US); Gregory J. Dunn, Arlington Heights, IL (US); Robert B. Lempkowski, Elk Grove, IL (US); Aroon V. Tungare, Winfield, IL (US); Jovica Savic, Downers Grove, IL (US)

(73) Assignee: Motorola, Inc., Schaumburg, IL (US)

(*) Notice: Subject to any disclaimer, the term of this patent is extended or adjusted under 35 U.S.C. 154(b) by 218 days.

(21) Appl. No.: 10/736,327

(22) Filed: Dec. 15, 2003

(65) Prior Publication Data

US 2005/0128720 A1 Jun. 16, 2005

(51) Int. Cl.
*H01L 21/20* (2006.01)
*H01G 4/00* (2006.01)

(52) U.S. Cl. .................... 438/381; 361/301.1
(58) Field of Classification Search ........... 438/381; 361/301.1
See application file for complete search history.

(56) References Cited

U.S. PATENT DOCUMENTS

| | | | |
|---|---|---|---|
| 5,027,253 A | 6/1991 | Lauffer et al. | |
| 5,261,153 A | 11/1993 | Lucas | |
| 5,796,587 A | 8/1998 | Lauffer et al. | |
| 6,005,777 A | 12/1999 | Bloom et al. | |
| 6,407,929 B1 | 6/2002 | Hale et al. | |
| 6,541,137 B1 | 4/2003 | Dunn et al. | |
| 2003/0113443 A1 | 6/2003 | Kingon et al. | |
| 2004/0047112 A1* | 3/2004 | Yoshida et al. | 361/523 |
| 2004/0118600 A1* | 6/2004 | Lee et al. | 174/260 |

* cited by examiner

*Primary Examiner*—David Nelms
*Assistant Examiner*—Long Tran
(74) *Attorney, Agent, or Firm*—James A. Lamb (57) ABSTRACT

One of a plurality of capacitors embedded in a printed circuit structure includes a first electrode (415) overlaying a first substrate layer (505) of the printed circuit structure, a crystallized dielectric oxide core (405) overlaying the first electrode, a second electrode (615) overlying the crystallized dielectric oxide core, and a high temperature antioxidant layer (220) disposed between and contacting the crystallized dielectric oxide core and at least one of the first and second electrodes. The crystallized dielectric oxide core has a thickness that is less than 1 micron and has a capacitance density greater than 1000 pF/mm$^2$. The material and thickness are the same for each of the plurality of capacitors. The crystallized dielectric oxide core may be isolated from crystallized dielectric oxide cores of all other capacitors of the plurality of capacitors.

22 Claims, 4 Drawing Sheets

FIG. 12

PRINTED CIRCUIT EMBEDDED CAPACITORS

This application is related to a co-pending application entitled "PEELABLE CIRCUIT BOARD FOIL" U.S. Ser. No. 10/682,557 filed on Oct. 09, 2003, assigned to the assignee of the instant application.

FIELD OF THE INVENTION

The present invention generally relates to capacitors that are integrated or embedded in rigid or flexible single or multilayer circuit boards.

BACKGROUND

The present invention generally relates to multi-layer foils suitable for making capacitors that are integrated or embedded in rigid or flexible single or multilayer circuit boards.

In the electronics art, smaller often means better. In the quest to provide smaller electronic appliances, the electronics industry seeks electronic components that are smaller than predecessor components.

The capacitor (a dielectric material sandwiched between two conductors) represents one electronic component that has substantially shrunk in this quest. However, current practice relies largely on individually mounting and soldering each capacitor onto the surface of circuit boards. Despite the advances in capacitor miniaturization, each surface mounted capacitor still occupies a significant fraction of the circuit board surface area, and requires substantial cost to "pick and place" onto the board. For example, a typical cellular phone contains over 200 surface mounted capacitors connected to circuit boards by over 400 solder joints. The ability to integrate or embed capacitors in circuit boards during manufacture of the circuit boards would provide substantial space and cost savings over surface mounted capacitors. Unfortunately, efforts to make capacitors that can be integrated or embedded into circuit boards have either produced capacitors that do not have sufficient capacitance (e.g. <10 pF/mm$^2$) to replace many of the capacitors (e.g., requiring >100 pF capacitance) on a circuit board, or have resulted in structures and processes that have not been scaled up to manufacturing volumes.

Printed circuit boards typically comprise multiple layers of copper and glass-reinforced epoxy or other polymer. The copper is patterned to form the conducting elements of the circuit, and the polymer provides dielectric isolation and mechanical robustness. Polymers are low dielectric constant materials, and therefore parallel plate embedded capacitors formed within the polymer dielectric circuit board do not offer high capacitance density.

Although ceramic dielectrics that have very high dielectric constants are available, they are typically too rigid to be mechanically compatible with organic printed circuit boards. Further, organic printed circuit boards are incompatible with the methods used to form the ceramic dielectric films. Ceramic dielectric films are commonly formed by a broad range of deposition techniques, such as chemical solution deposition (CSD), evaporation, sputtering, physical vapor deposition and chemical vapor deposition. However, in order to achieve the requisite dielectric structure, such techniques typically require either a high-temperature deposition or a high-temperature crystallization. Such temperatures would melt, ignite or otherwise degrade the organic materials in the circuit board substrate.

Furthermore, these processes are incompatible with copper in two ways. First, at the high temperatures and oxidizing conditions needed to form the ceramic dielectric, copper forms a thin layer of copper oxide at the interface between the ceramic dielectric and the copper. This effectively forms an interface layer which will degrade the overall device performance, thus negating any advantage gained by the use of the ceramic dielectric. Second, the reducing atmosphere favored by copper produces excessive defect concentrations and may frustrate phase formation in the dielectric oxide layer. Efforts to form ceramic films at temperatures that are compatible with circuit board components have generally compromised the dielectric properties of the resulting ceramic. For ceramic dielectrics, it is apparent that favorable dielectric properties are intimately linked to a complex crystal structure (e.g., perovskite) that is difficult to develop at lower temperatures.

Dielectric oxides such as lead zirconate titanate (PZT) and lead lanthanum zirconate titanate (PLZT) belong to a particularly promising class of high permittivity ceramic dielectrics with the perovskite crystal structure. When formed by the CSD process, dielectric oxides can be made into very thin, flexible, robust layers with very high dielectric constants.

Several methods have been proposed to create a thin structure that is intended to be added to a circuit board using compatible circuit board layering techniques, by adding a thin coating of dielectric oxide to a thin foil of copper. Although some aspects of how such a material would be manufactured, integrated into a circuit board structure, and patterned have been described, improvements that use these methods in unique ways for a wide variety of applications are desirable.

What is needed is a structure and process for adding capacitors formed of high dielectric constant materials to rigid or flexible circuit boards that are economical to manufacture and wherein the structure is in a form compatible with multilayer circuit board stacking techniques that are in wide use today.

BRIEF DESCRIPTION OF THE DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Before describing in detail the particular printed circuit embedded capacitors in accordance with the present invention, it should be observed that the present invention resides primarily in combinations of method steps and apparatus components related to embedded capacitors for circuit boards. Accordingly, the apparatus components and method steps have been represented where appropriate by conventional symbols in the drawings, showing only those specific details that are pertinent to understanding the present invention so as not to obscure the disclosure with details that will be readily apparent to those of ordinary skill in the art having the benefit of the description herein.

The unique, large value, isolated embedded capacitors of the present invention may be formed starting with a dielectric foil that is applied to a sub-structure of a printed circuit board that when completed comprises at least two substrate layers. The fabrication of the completed printed circuit board (also called herein a printed circuit structure) including the embedded capacitors of the present invention is compatible with printed circuit board materials that would typically be substantially degraded if attempts to crystallize the dielectric materials were performed in situ on the printed circuit board sub-structure itself. The technique of the present invention is compatible with commonly used printed circuits that need only withstand the processes typically used for printed circuit soldering. For example, the technique of the present invention is fully compatible with the printed circuit material known as FR-4, which passes a 10 second solder dip test at 288 degrees Centigrade and has a degradation temperature of 300 degrees Centigrade. Moreover, the technique of the present invention is fully compatible with printed circuit materials such as FR-4 that typically have a surface roughness on the order of microns, and is therefore distinguished from prior art techniques, especially those involving vacuum deposition of thin (<1 micron) films on polymers such as Teflon and polyimide that, while offering higher temperature compatibility and smoother surfaces, are more expensive than FR4 and substantially more difficult to metallize and process.

The technique involves the use of a foil that includes a crystallized dielectric oxide material that is applied to the printed circuit sub-structure after the dielectric oxide is applied to a metal foil layer and then crystallized, at temperatures up to 600 degrees Centigrade. One method of fabricating such a foil is described in some detail with reference to FIGS. 1–4; other methods could be used. One example of another method is described in U.S. Publication 2003/0113443A1, published on Jun. 19, 2003. While the electrodes formed by the methods described with reference to FIGS. 1–4 are relatively thin (on the order of 25 microns or less), other methods could result in a foil having a thickness of at least one electrode layer that is up to approximately 70 microns.

FIGS. 5–10 describe in some detail the formation of the large value embedded capacitors in the printed circuit structure.

Figure 1:
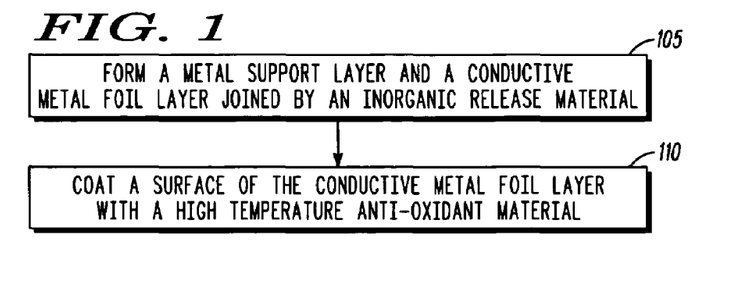
FIG. 1 is a flow chart that shows a method for fabricating a peelable circuit board foil in accordance with an embodiment of the present invention.
Figure 2:
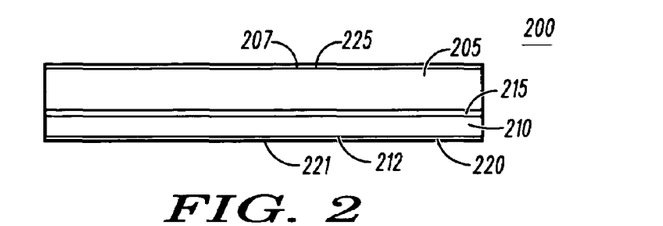
FIG. 2 is a cross section diagram of the peelable circuit board foil fabricated by the method described with reference to FIG. 1.

Referring to FIG. 1, a method for fabricating a peelable circuit board foil 200 is shown, in accordance with an embodiment of the present invention. A cross sectional view of the peelable circuit board foil 200 is shown in FIG. 2. At step 105 (FIG. 1) a metal support layer 205 (FIG. 2) and a conductive metal foil 210 (FIG. 2) are formed that are joined at first surfaces using an inorganic release material 215 (FIG. 2). This inorganic release material 215 retains its ability to separate the two metal layers 205, 210 after exposure to high temperatures (used to add a crystallized dielectric layer to the peelable circuit board foil 200, as described below with reference to FIGS. 3 and 4). The inorganic release material consists essentially of a co-deposited admixture of a metal and a non-metal, and may be formed using known techniques such as those described in U.S. Pat. No. 6,346,335,B1 issued to Chen et al. on Feb. 12, 2002. In accordance with this embodiment of the present invention, the metal support layer 205 may be between 10 and 75 microns thick, and for most uses is between 30 and 70 microns thick; the conductive metal foil 210 may be between 5 and 25 microns thick and for most uses is between 10 and 20 microns thick; and the inorganic release material may be less than 0.030 microns thick. Because the present invention is for fabrication of a dielectric foil (and, ultimately, the formation of capacitors in a layer or layers of multi-layer printed circuit boards), the conductive metal foil 210 of the present invention is normally thicker than that used for conventional metal foils having a release layer (for example, see U.S. Pat. No. 6,346,335). The optimum metal for the metal support layer 205 and the conductive metal foil 210 for most applications is copper or a copper alloy, but other metals such as nickel or a nickel alloy could be used.

At step 110 (FIG. 1), a second surface 212 of the metal foil layer 210 may be coated with a high temperature anti-oxidant barrier 220 (FIG. 2), and the resulting coated second surface (221) has a surface roughness less than 0.05 micron root mean square (RMS). The high temperature anti-oxidant barrier 220 is one that is effective to prevent any substantial oxidation of the conductive metal foil 210 during a later step in which a dielectric oxide is applied, pyrolyzed, and crystallized by known techniques, at temperatures as high as about 600 degrees centigrade, and has performance benefits compared to typical anti-tarnish coatings used for conventional peelable circuit board foils that perform well at temperatures below 100 degrees centigrade.

This high temperature anti-oxidant barrier may be deposited on the conductive metal foil 210 by sputtering, electroless plating or electrolytic plating materials that may be selected from palladium, platinum, iridium, nickel, or alloys or compositions that include any combination of these metals with other materials, for example, minor amounts of aluminum or other materials, using known techniques that will achieve a surface roughness of less than 0.05 micron RMS, and which will typically achieve a surface roughness less than 0.01 micron RMS.

Electroless or electrolytic nickel phosphorus is useful as the high temperature anti-oxidant in many applications. The phosphorous content of the nickel-phosphorous generally ranges from about 1 to about 40 wt % phosphorous, more specifically about 4–11 wt % and even more specifically about 6–9 wt %. Typically, the technique chosen to coat the conductive metal foil layer 210 will result in a second surface 207 (FIG. 2) of the metal support layer 205 also being coated with the same high temperature anti-oxidant barrier 225 (FIG. 2) to about the same thickness, but this is not a required result for the present invention. For example, an acceptable alternative technique would comprise masking the second surface of the metal support layer 205 with a resist or other polymer material during the plating step so that the high temperature anti-oxidant barrier is applied to only the conductive metal foil 210, leaving the metal support layer 205 uncoated. In contrast to conventional peelable circuit board foils, for example the CopperBond® Thin Copper Foil distributed by Olin Corporation Metals Group of Waterbury, Conn., for which the exposed surface of the conductive metal foil may be intentionally roughened by a dendrite forming process, the resulting surface of the conductive metal foil 210 of the present invention is kept smooth, with a roughness measurement less than 0.05 microns root mean square (RMS), and more preferably less than 0.01 micron RMS. Such smoothness can be achieved by known techniques that are used to form the conductive metal foil 210 and the high-temperature anti-oxidant barrier 220. The peelable circuit board foil 200 formed by the method described with reference to FIG. 1 is conveniently able to be made in sizes commensurate with conventional printed circuit boards and handled and shipped without having to use expensive techniques to protect it from wrinkling or tearing during shipment, handling, and processing.

Figure 3:
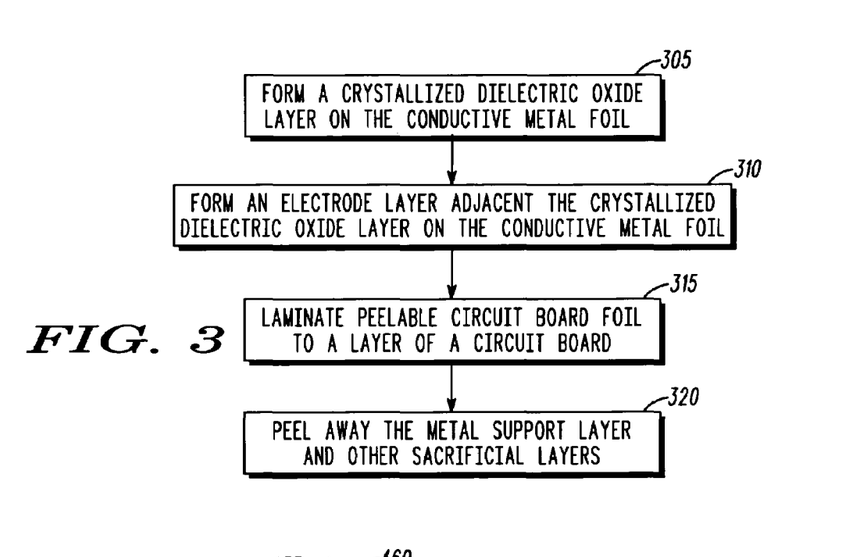
FIG. 3 is a flow chart that shows a method for fabricating a peelable circuit board foil in accordance with a second embodiment of the present invention.
Figure 4:
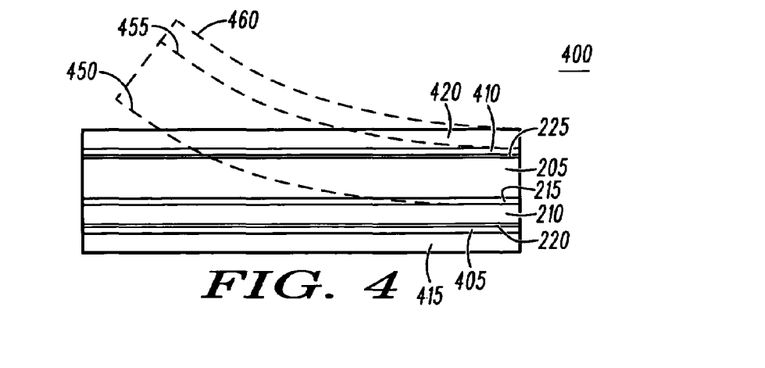
FIG. 4 is a cross section diagram of the peelable circuit board foil fabricated by the method described with reference to FIG. 3.

Referring now to FIG. 3, a method for fabricating a dielectric peelable circuit board foil 400 from the peelable circuit board foil 200 is shown, in accordance with a second embodiment of the present invention. A cross sectional view of the dielectric peelable circuit board foil 400 is shown in FIG. 4. At step 305, a crystallized dielectric oxide layer 405 (FIG. 4) is formed adjacent to the conductive metal foil 210 of a peelable circuit board foil 200. Specific examples of the crystallized dielectric oxide according to this invention include lead zirconate titanate (PZT), lead lanthanide zirconate titanate (PLZT), lead calcium zirconate titanate (PCZT), lead lanthanide titanate (PLT), lead titanate (PT), lead zirconate (PZ), lead magnesium niobate (PMN), barium titanate (BTO) and barium strontium titanate (BSTO). Lead based dielectric oxides comprising the PZT system, particularly compositions comprising the PCZT formula $PbCa_x(Zr_{0.52}Ti_{0.48})O_3$, where x is from 0.01 to 0.1, are particularly attractive. The addition of small quantities of elements such as Ni, Nb, Ca and Sr in compounds that do not specifically name them can also improve electrical performance. Accordingly, the dielectric oxides of the present invention may also contain small quantities of Ni, Nb, Ca and Sr.

The crystallized dielectric oxide is formed at step 305 by one of a broad range of deposition techniques, such as chemical solution deposition (CSD), evaporation, sputtering, physical vapor deposition and chemical vapor deposition. These techniques typically require either a high-temperature deposition or a high-temperature crystallization, and result in a crystalline coating on the conductive metal foil 210 that is polycrystalline in form and quite flexible, while maintaining excellent dielectric properties for forming capacitors even when flexed. An economical, well known technique that can be used for forming the crystalline dielectric oxide layer is to use CSD. Another economical technique for forming the crystalline dielectric oxide layer is powder coating using a powder or powder suspension. The crystallized dielectric oxide material formed by these techniques is most often of a polycrystalline nature, as is well known in the art. The crystallized dielectric oxide layer 405 may be formed with a thickness from about 0.1 to about 1 micron. When the crystallized dielectric oxide layer 405 is PCZT, it may be formed to be 0.2–0.6 micron thick for many uses, and will provide capacitance densities that exceed 1000 picoFarad per square millimeter (1000 $pF/mm^2$), and that are typically 3000 $pF/mm^2$ or more, while still providing high production yields and necessary breakdown voltages (e.g., greater than 5 volts). The values of capacitance used throughout this document are specified at 1 Megahertz, unless otherwise stated. When the crystallized dielectric layer is formed by the cost effective methods of CSD or powder coating at thicknesses less than 0.2 microns thick, defects tend to arise in the form of pinhole shorts between the conductive metal foil 210 and the electrode layer 415. Other techniques, such as sputtering, may allow thinner crystallized dielectric oxide layers, but they are much less economical and the layer may be too thin to withstand handling. The dip coating technique and other techniques may also result in the formation of a sacrificial crystallized dielectric oxide layer 410 adjacent the metal support layer 205, but this layer is not required for the present invention. For some coating techniques, allowing the formation of the sacrificial crystallized dielectric oxide layer 410 on the metal support layer 205 is projected to be less costly than attempting to prevent its formation, and serves to reduce curling of the foil layer that may result when only the crystallized dielectric oxide layer 405 is formed.

The peelable circuit board foil 400 formed by the method described with reference to step 305 of FIG. 3 can be conveniently made in sizes commensurate with conventional printed circuit boards and handled and shipped without having to use expensive techniques to protect it from wrinkling or tearing during shipment, handling, and processing. This peelable circuit board foil 400 can then be used to apply the dielectric layer 405 and the conductive metal foil layer 210 within (or on) a flexible or rigid printed circuit board stack to form capacitors having different dielectric areas. This is done by adhering the dielectric layer 405 of the peelable circuit board foil 400 to a conductive metal layer surface of a flexible or rigid printed circuit board stack using an appropriate conductive adhesive material or other known technique, then peeling away the metal support layer 205, the sacrificial crystallized dielectric oxide layer 410, and the high temperature anti-oxidant barrier 225 as indicated by the dotted lines 450, 455 in FIG. 4, followed by well known etching and metal deposition steps that form individual capacitors. In one embodiment, a single capacitor is formed within an entire layer of the printed circuit board, such as for a power source layer.

Referring again to FIGS. 3 and 4, at step 310 (FIG. 3), an electrode layer 415 (FIG. 4) may be formed adjacent the crystallized dielectric layer 405 on the conductive metal foil 210 (i.e., on the surface of the crystallized dielectric layer that is opposite the conductive metal foil 210), using a well known technique such as sputtering or electroless plating or electrolytic plating. A typical thickness for the electrode layer 415 is 2 to 20 microns. Depending on the technique used to apply the electrode layer 415, a sacrificial electrode layer 420 of approximately the same thickness as the electrode layer 415 may also be formed, adjacent the crystallized dielectric layer 410 on the metal support layer 205 (i.e., on the surface of the crystallized dielectric layer that is opposite the metal support layer 205), but this is not required for the present invention.

The peelable circuit board foil with the electrode layer 415 can be laminated to a circuit board substrate at step 315

(FIG. 3), e.g., by pressing onto a prepreg layer (glass-reinforced B-stage epoxy), which is a well known technique that uses pressure and temperature to flow and then cure the epoxy. When the metal support layer 205 is peeled away from the conductive metal foil layer 210 at step 320 (FIG. 3), the sacrificial electrode layer 420, if present, is also peeled away, as shown by dotted lines 450, 460 in FIG. 4.

By now it should be appreciated that the peelable circuit board foils 200, 400 and the processes to fabricate them provide foils that economically facilitate the addition of capacitors to flexible and rigid circuit boards. The inorganic release layer remains effective after exposure to the high temperatures of pyrolysis and crystallizing; the peelable metal support layer and double layers of crystallized dielectric oxide (in one embodiment) help provide a foil that is formed flat and does not wrinkle or crease, and the sacrificial metal support and dielectric oxide layers may be easily removed during the process of adding a capacitive layer to a circuit board using the present invention.

Figure 5:
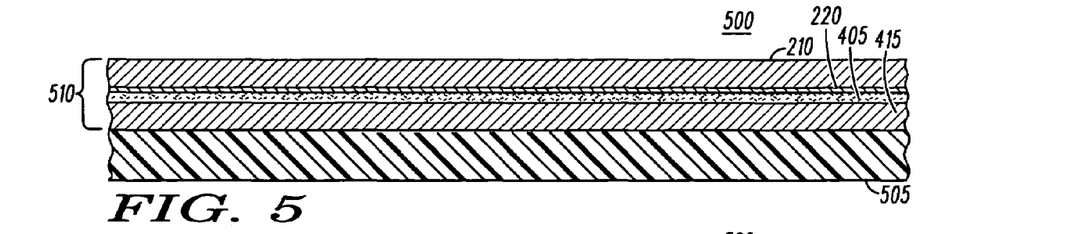
FIGS. 5–9 are cross sectional views of the top layer of a small portion of a printed circuit sub-structure that includes at least one isolated, large value embedded capacitor in various stages of fabrication, in accordance with a third embodiment of the present invention.

FIGS. 5–10 are cross sectional views and flow charts illustrating the fabrication of embedded capacitors within a printed circuit structure, in accordance with a third embodiment of the present invention. FIG. 5 is a cross sectional view of the top layer 505 of a small portion of a printed circuit sub-structure 500 to which a dielectric foil 510 has been applied. The term "sub-structure" refers to the printed circuit board during the various stages of fabrication. The printed circuit layers may be formed of commonly used printed circuit board materials such as FR4, but is also compatible with most available multi-layer printed circuit materials. The dielectric foil 510 is exemplified by the foil embodiments in accordance with the present invention that have been described herein above, but it should be appreciated that other foils may have the same physical structure after they are applied to the printed circuit sub-structure. In accordance with the foils of the present invention, the dielectric foil 510 is applied to the surface of the top layer 505 by one of several techniques. In several of the techniques, the top layer 505 is a well known "pre preg" layer. In one technique the surface of the electrode layer 415 is intentionally roughened, such as by the dendritic growth method described above, the foil is applied to the pre-preg layer and the printed circuit substructure is treated to complete the adhesion process. In another technique in which the surface of the electrode layer 415 is smooth, an adhesion promotion substance is applied to the surface of the electrode layer 415 and then it is applied to the pre-preg layer and the printed circuit substructure is treated to complete the adhesion process.

Figure 10:
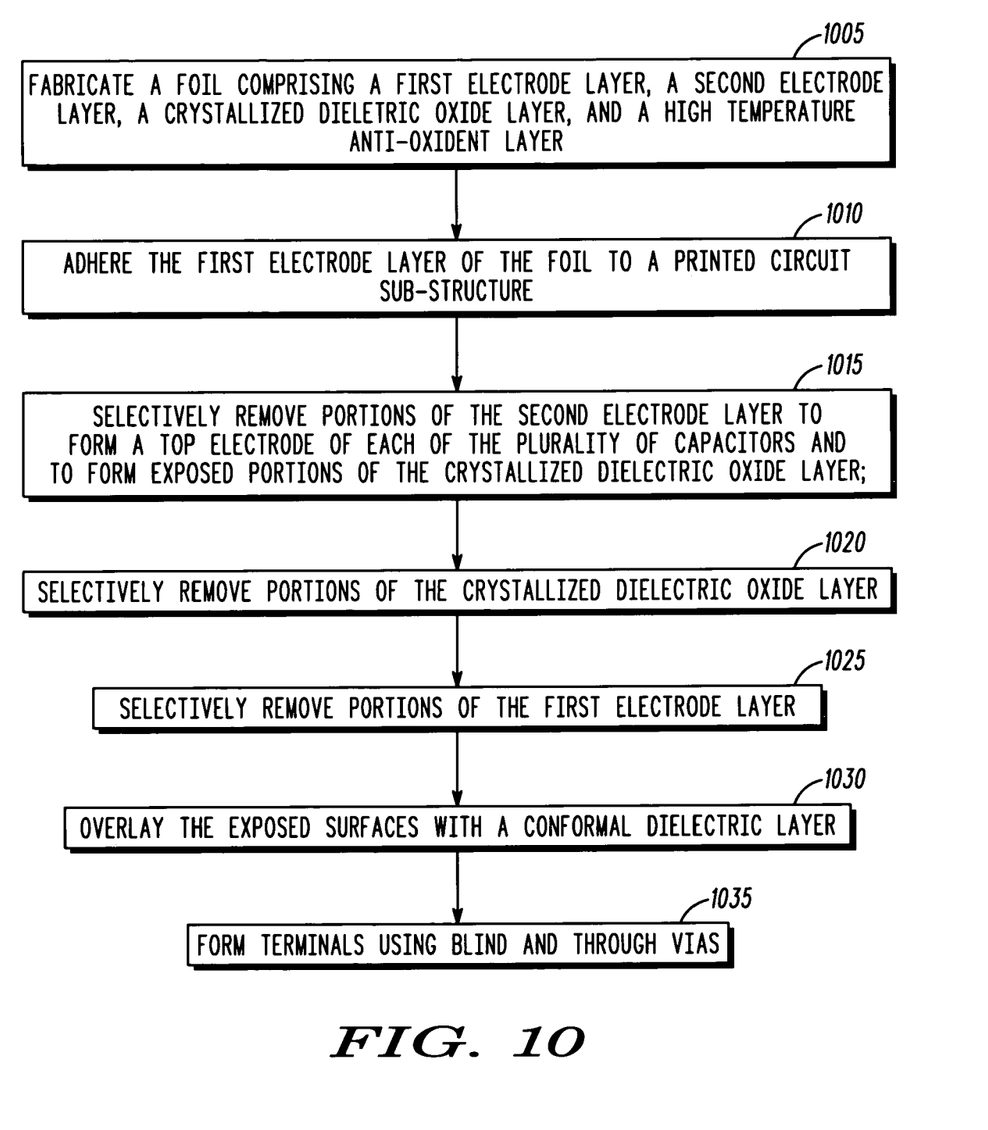
FIG. 10 is a flow chart showing some steps used to fabricate a printed circuit sub-structure that includes at least one isolated, large value embedded capacitor, in accordance with a third embodiment of the present invention.

The process as it has been described so far may be summarized using steps that are shown in FIG. 10. At step 1005, a dielectric foil 510 (e.g., foil 400) is fabricated that comprises a first electrode layer (e.g., the electrode layer 415), a second electrode layer (e.g., the conductive metal foil 210), a crystallized dielectric oxide layer (e.g., 405) (alternatively referred to as a crystallized dielectric oxide core) disposed between the first electrode layer 415 and the second electrode layer 210, and a high temperature anti-oxidant layer (e.g., 220) between and contacting the crystallized dielectric oxide layer 405 and the second electrode layer 210. The crystallized dielectric oxide 405 may comprise lead calcium zirconium titanate and may be less than 1 micron thick and have a capacitive density greater than 1000 pF/mm$^2$. At step 1010, the first electrode layer of the foil 510 is adhered to a printed circuit sub-structure 500.

It will be appreciated that when a foil other than the type described with reference to FIGS. 1–4 is used in the present invention, the high temperature anti-oxidant layer (e.g., 220) may be formed between and contacting the first electrode layer 415 and the crystallized dielectric oxide layer 405 instead of, or in addition to, being between and contacting the second electrode layer 210 and the crystallized dielectric oxide layer 405.

Figure 6:
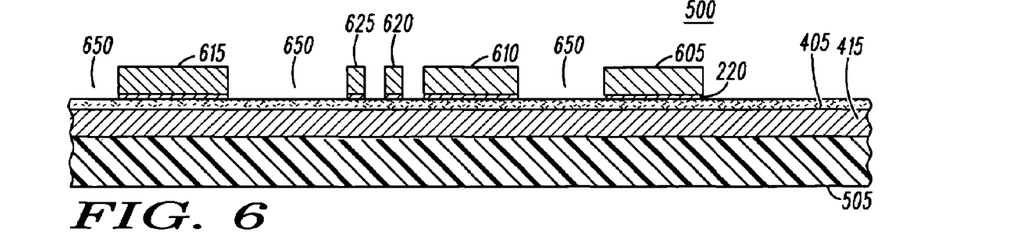
Figure 11:
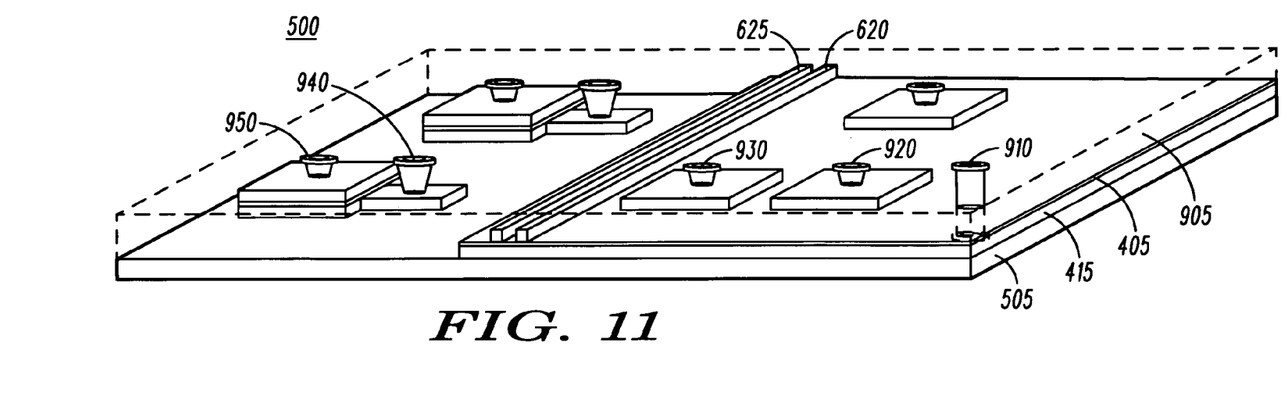
FIG. 11 is a perspective view showing a printed circuit sub-structure that includes the printed circuit sub-structure described with reference to FIGS. 5–8, in accordance with a third embodiment of the present invention.

At step 1015 (FIG. 10), portions 650 (FIG. 6) of the second electrode layer 210 and high-temperature antioxidant layer 210 are selectively removed to form a top electrode 605, 610, 615 of each of a plurality of capacitors and to form exposed portions 650 of the crystallized dielectric oxide layer 405. The well known technique of photolithographic patterning and etching as commonly practiced by printed circuit manufacturers may be used for this selective removal. FIG. 6 is a cross sectional view of the portion of the printed circuit sub-structure 500 in accordance with the third embodiment of the present invention after step 1015 has been completed. In this example, three top electrodes 605, 610, 615 have been produced by the etching, as well as two circuit runners 620, 625. The three dimensional shapes of these electrodes and circuit runners may be better understood by viewing FIG. 11, which is a perspective drawing of the portion of the printed circuit sub-structure 500 after the steps described herein are completed. The printed circuit sub-structure 500 may not be complete at that point, because additional layers may be added that may include additional embedded capacitors, or if no more layers are added, surface mount parts such as integrated circuits may be added. The removal of the portions of the second electrode layer 210 and anti-oxidant layer 220 also exposes portions 650 of the crystallized dielectric oxide layer 405.

Figure 7:
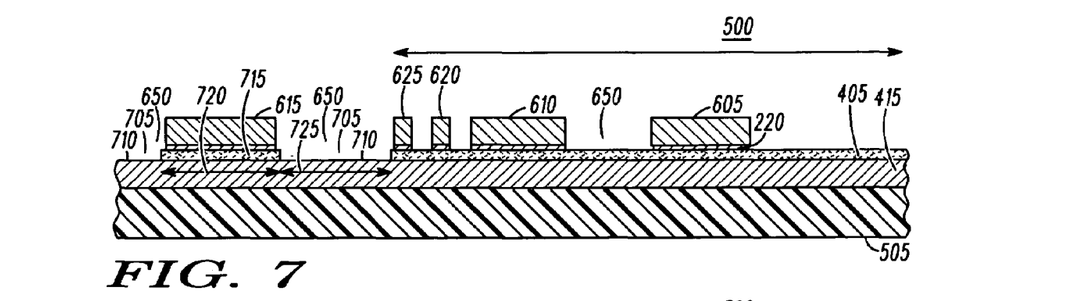

At step 1020 (FIG. 10), portions 705 (FIG. 7) of the crystallized dielectric oxide layer 405 are selectively removed within the exposed portions 650 of the crystallized dielectric layer 405 to form one or more capacitors of the plurality of capacitors that have an isolated dielectric core 715, and to form exposed portions 710 of the first electrode layer. FIG. 7 is a cross sectional view of the portion of the printed circuit sub-structure 500 in accordance with the third embodiment of the present invention after step 1020 has been completed. The present invention provides for one or more isolated capacitors by this unique step that selectively removes portions 705 of the crystallized dielectric oxide layer 405 within the portions 650 exposed by patterning of the second electrode 210. "Within" as used in this context means that some or all of the exposed portions 650 of the crystallized dielectric oxide layer 405 are removed. The portions removed 705 may include a circumscribing portion around each isolated dielectric core 715, in order to effect a physical isolation of the isolated dielectric core 715 from other portions of the crystallized dielectric layer 405. The exposed portions 710 of the first electrode typically include an area 725 adjacent to each of the isolated dielectric cores 715 that is large enough to form an electrical connection to the portion of the first electrode forming a bottom electrode 720 under the isolated dielectric core 715. Particular circuit requirements may have a signal coupled to two or more capacitors that are isolated as a group from other capacitors, thereby requiring an area of the first electrode layer 415 for only one via to effect a connection of their bottom electrodes to a surface termination, but a circuit runner to the bottom electrode 720 under each isolated capacitor would still be needed.

A key advantage of patterning the crystallized dielectric oxide 405 is that it exposes portions of the first electrode layer 415, allowing the bottom electrode to be patterned. This is essential, for example, to allow a clearance annulus to be patterned around the location of a future drilled plated through hole. Without the clearance annulus, any plated through hole will necessarily be shorted to the first electrode of any capacitors sharing it. In one implementation, all embedded capacitors are decoupling capacitors that go to ground, which is the second electrode layer 415. In this case, the bottom (ground) electrode need not be patterned to isolate the capacitors from each other. However, without clearance annuli provided by the present invention, all plated through holes would be shorted to ground.

Means for effecting the selective removal of the portions of the crystallized dielectric oxide layer 405 include techniques such as pumice scrubbing, other abrasion techniques, sand blasting, or laser scribing. For pumice scrubbing, other abrasion techniques, or sand blasting, the top electrodes 605, 610, 615 may be sufficient to withstand the removal technique without excessive thickness degradation (depending on the material and thickness of the top electrodes 605, 610, 615 and on the technique and medium—e.g., the type of particle in sand blasting—used). Alternatively, photoresist material left on top of the top electrodes 605, 610, 615 (not shown in FIGS. 5–11) may provide sufficient protection. Photoresist or other protective material may alternatively be added for additional protection of the top electrodes 615 for isolated dielectric cores 715 prior to the removal means used at step 1025. Photoresist or other protective material may also be needed over an entire region 750 for which capacitors with shared dielectric cores are to be used. Because the present invention can provide isolated capacitors of a capacitive density that is so much larger than prior art techniques, the need for capacitors that use shared dielectric cores is substantially reduced, but they may be warranted for some situations. As can be seen by this example, the present invention allows for both types.

Figure 8:
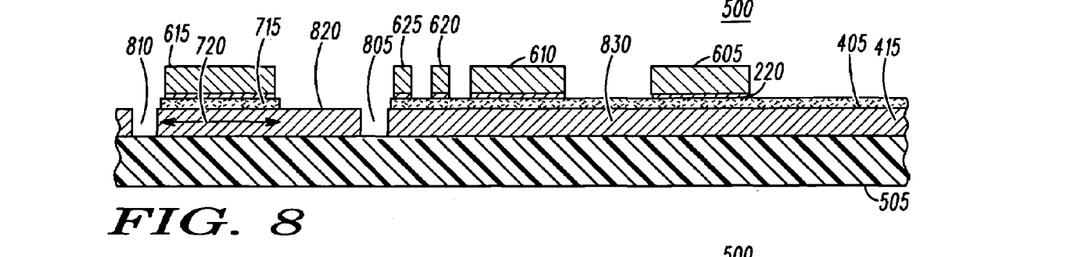

At step 1025 (FIG. 10), portions 805, 810 (FIG. 8) of the first electrode layer 415 within exposed portions thereof 710 are selectively removed to form and provide electrical connection to the bottom electrode 720 of each of the one or more isolated capacitors that have an isolated dielectric core 715. FIG. 8, is a cross sectional view of the portion of the printed circuit sub-structure 500 in accordance with the third embodiment of the present invention after step 1025 has been completed. "Within" as used in this context means that some or all of the exposed portions 710 of the first electrode layer 415 are removed. The portions removed include portions 805, 810 that provide isolation of the bottom electrode 720 from other capacitors (shared or isolated). The portions that remain are the bottom electrodes under the isolated dielectric cores 715, the areas 820 that connect the bottom electrodes 720 to other components of the completed printed circuit structure, and the portions 830 that are under and that connect shared capacitors.

Figure 9:
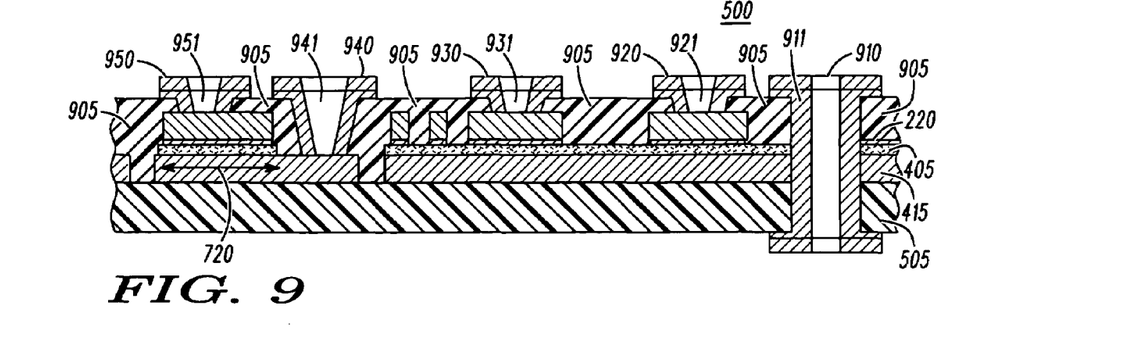

At step 1030 (FIG. 10), exposed surfaces are overlaid with a conformal dielectric material 905 such as pre-preg or resin-coated foil. FIG. 9, is a cross sectional view of the portion of the printed circuit sub-structure 500 in accordance with the third embodiment of the present invention after step 1030 and subsequent steps have been completed. The exposed surfaces include at least the surfaces of the top electrodes 605, 610, 615; the exposed common portion of the crystallized dielectric layer 405 that underlies the top electrodes 605, 610 of the shared capacitors and the runners 620, 625; the exposed top electrodes 615 of the isolated dielectric cores 715; the sides of the isolated dielectric cores 715; the exposed surfaces of the first electrode 415, and exposed areas of the top layer 505 of the printed circuit sub-structure. The conformal material 905 is any material that has properties such as: it can conformally coat the exposed surfaces, it can provide sufficient dielectric isolation between the coated conductive parts, it can be used to add a new conductive layer to the printed circuit sub-structure, and it can be worked to form electrical vias, At step 1035 (FIG. 10), terminals 910, 920, 930, 940, 950 are formed using blind vias 921, 931, 941, 951 and plated through holes 911. FIG. 9 is a cross sectional view of the portion of the printed circuit sub-structure 500 in accordance with the third embodiment of the present invention after step 1035 has been completed. The blind vias 921, 931, 951 are used to electrically connect the top electrodes 605, 610, 615. The blind via 941 is used to couple to the bottom electrode 720 of the isolated capacitor. Alternatively, the blind via 941 can provide the connection to a shared arrangement of common bottom electrodes 720 of multiple capacitors, formed to provide an area function such as a ground plane. The plated through hole 911 is used to couple to the second electrode layer 415 under the entire region 750 (shared portion) of the printed circuit sub-structure 500. The vias and through holes can be formed by conventional techniques and the terminals are added by conventional techniques.

It will be appreciated from the above descriptions that the plurality of capacitors that are embedded in the printed circuit structure formed from the printed circuit sub-structure 500 may be described as comprising a patterned first electrode overlaying a first substrate layer of the printed circuit structure, a patterned crystallized dielectric oxide core overlaying the patterned first electrode, a patterned second electrode overlying the patterned crystallized dielectric oxide core, and a patterned high temperature antioxidant layer disposed between and contacting both the crystallized dielectric oxide layer and the second electrode. The patterned second electrode is within the boundaries of the patterned crystallized dielectric oxide core, which is within the boundaries of the patterned first electrode. The patterned first electrode may include at least one clearance annulus that is exposed by the patterned crystallized dielectric oxide core, wherein the at least one clearance annulus provides clearance for a plated through hole that does not contact the patterned first electrode, and may include an area that is a bottom electrode for one or more capacitors and a corresponding at least one contiguous area that is exposed by the patterned crystallized dielectric oxide core, wherein the corresponding at least one contiguous area provides for connection to a blind via.

It will be appreciated that integrated circuits and other electrical components, especially those that are the surface mounted type, may now be economically coupled to isolated capacitors of substantially high value by using the present invention, with very small conductive distances between the terminals of the integrated circuits and other electrical components. For example, the terminal of an integrated circuit could be located directly atop the terminal for the top electrode of an isolated capacitor and another terminal of the same integrated circuit could be located directly atop a terminal coupled to the bottom electrode of the isolated capacitor, in a situation in which the separation of the terminals of the integrated circuit is essentially equal to one side of a capacitor that is square. In such an example, an integrated circuit that is 15 millimeters wide might have a capacitor of the present invention that is approximately 225 square millimeters and that provides on the order of 0.6 micro farads essentially directly coupled to two terminals of the integrated circuit located 15 millimeters apart on opposite side of the integrated circuit. The total length of the conductors between the integrated circuit and the capacitor could be less than 100 microns. Alternatively, ten bypass or decoupling capacitors of value greater than 0.01 microfarad could be coupled to two terminals of an IC using similar extremely short total conductive lengths.

Figure 12:
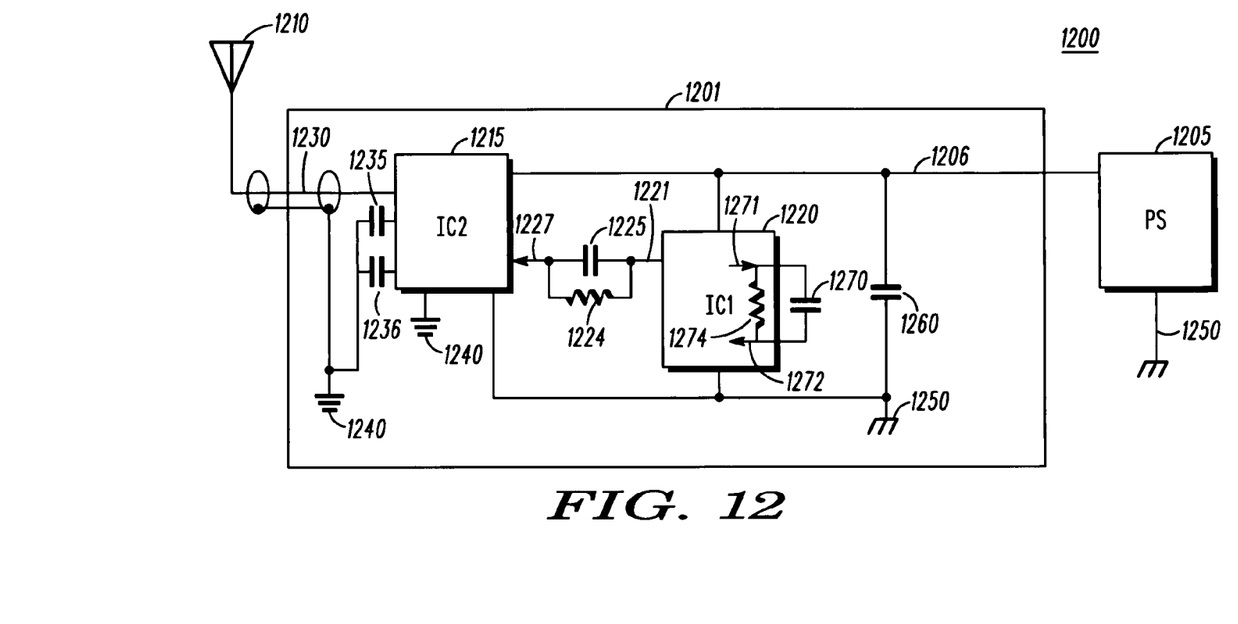
FIG. 12 is an electrical block diagram showing an electronic device that incorporates embedded capacitors in accordance with the embodiments of the present invention described with reference to FIGS. 1–11.

Referring now to FIG. 12, an electrical block diagram shows an electronic device 1200 that incorporates embedded capacitors in accordance with the embodiments of the present invention described above. The electronic device can be any electronic device that uses a multilayer printed circuit board 1201 having a power source 1205. The power source 1205 generates a DC supply voltage 1206 that is coupled to integrated circuit 1 (IC1) 1220, IC2 1215, and at least one power decoupling capacitor 1260. There may a plurality of power decoupling capacitors 1260, such as those connected to terminals 920 and 930 in FIG. 11, which have a common ground terminal 910. In the case of the electronic device 1200, the power decoupling capacitors 1260 are coupled to a chassis ground 1250, as is the power source 1205. IC1 1220 generates an internal signal 1271 that is filtered by an internal resistor 1274 and an external, embedded coupling capacitor 1270, and returned to IC1 1220 as filtered signal 1272. The embedded coupling capacitor 1270 is a capacitor of high capacitive density having an isolated dielectric core, in accordance with the embodiments of the present invention described above with reference to FIGS. 1–11. IC1 1220 generates another signal 1221 that is filtered by resistor 1224 and embedded coupling capacitor 1225. The filtered signal 1227 is coupled to IC2 1215. The embedded coupling capacitor 1225 is also a capacitor of high capacitive density having an isolated dielectric core, in accordance with the embodiments of the present invention described above with reference to FIGS. 1–11. IC2 1215 has a radio frequency (RF) output amplifier that is grounded to an RF ground 1240. An output of the RF amplifier 1230 is coupled to an antenna 1210 by a coaxial cable 1230 that is also coupled to the RF ground 1240. Two embedded de-coupling capacitors 1235, 1236 provide bypass filtering to the RF ground for two undesired RF signals (e.g., spurious frequencies). In this instance, the two embedded de-coupling capacitors 1235, 1236 are capacitors of high capacitive density and have common bottom electrodes that are connected to the RF ground 1240, but the RF ground 1240 is isolated from other bottom electrodes of the other capacitors in the same embedded layer of the printed circuit board 1201. The electronic device is representative of any electronic device that can use patterned resistors to perform the functions of the electronic device 1200, such as cellular telephones, personal digital managers, toys, appliances, test equipment, controllers, computers, weapons, displays, televisions, etc. All such devices may benefit from the present invention.

In the foregoing specification, the invention and its benefits and advantages have been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims.

As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "including" and/or "having", as used herein, are defined as comprising.

The invention claimed is:

1. A method for fabricating a plurality of capacitors embedded in a printed circuit structure, comprising:
    fabricating a foil comprising a first electrode layer, a second electrode layer, a crystallized dielectric oxide layer disposed between the first electrode layer and the second electrode layer, and a high temperature anti-oxidation barrier between and contacting the crystallized dielectric oxide layer and at least one of the first and second electrode layers, wherein the crystallized dielectric oxide layer is less than 1 micron thick and has a capacitive density greater than 1000 pF/mm$^2$;
    adhering the first electrode layer of le foil to a printed circuit sub-substrate;
    selectively removing portions of the second electrode layer to form a top electrode of each of the plurality of capacitors and to form exposed portions of the crystallized dielectric oxide layer;
    selectively removing portions of the crystallized dielectric oxide layer within the exposed portions thereof to form exposed portions of the first electrode layer; and
    selectively removing portions of the first electrode layer within exposed portions thereof to form a bottom electrode of each of the plurality of capacitors;
    wherein an essentially coextensive portion of the high temperature anti-oxidation barrier is simultaneously removed with one of the first and second electrode layers.

2. The method for fabricating a plurality of capacitors according to claim 1, wherein selectively removing portions of the first electrode layer, further comprises forming the bottom electrode beyond the area of the isolated dielectric core to provide an electrical connection to one of a plated via and a plated through hole.

3. The method for fabricating a plurality of capacitors according to claim 1, wherein the portions of the crystallized dielectric oxide layer are selectively removed by one of abrasion and laser scribing.

4. The method for fabricating a plurality of capacitors according to claim 1, wherein selectively removing portions of the crystallized dielectric oxide layer further comprises placing a pattern of material to protect portions of the first electrode layer and the crystallized dielectric oxide layer that are not to be removed.

5. The method for fabricating a plurality of capacitors according to claim 1, wherein selectively removing portions of the first electrode layer and selectively removing portions of the second electrode layer each comprise a photolithographic chemical etching process.

6. The method for fabricating a plurality of capacitors according to claim 1, wherein the crystallized dielectric oxide layer has a capacitance density greater than 2000 pF/mm$^2$.

7. The method for fabricating a plurality of capacitors according to claim 1, wherein the first and second electrode layers each comprise a metal selected from a group consisting of copper, copper alloys, nickel, and nickel alloys.

8. The method for fabricating a plurality of capacitors according to claim 1, wherein the first and second electrodes are each less than 25 microns thick.

9. The method for fabricating a plurality of capacitors according to claim 1, wherein the high temperature anti-oxidation barrier comprises, by weight, more than 50% of one of palladium, platinum, iridium, and nickel or a combination thereof.

10. The method for fabricating a plurality of capacitors according to claim 9, wherein the high temperature anti-oxidation barrier further comprises, by weight, no more than 49% of one or more elements other than palladium, platinum, iridium, and nickel.

11. The method for fabricating a plurality of capacitors according to claim 10, wherein the one or more elements other than palladium, platinum, iridium, and nickel are aluminum, chromium, and phosphorus.

12. A method for fabricating a plurality of capacitors embedded in a printed circuit structure, comprising:
   adhering a first electrode layer of a foil to a printed circuit sub-structure, wherein the foil the first electrode layer, comprises a second electrode layer, a crystallized dielectric oxide layer disposed between the first electrode layer and the second electrode layer, and a high temperature anti-oxidation barrier between and contacting the crystallized dielectric oxide layer and at least one of the first and second electrode layers, wherein the crystallized dielectric oxide layer is less than 1 micron thick and has a capacitive density greater than 1000 pF/mm$^2$;
   selectively removing portions of the second electrode layer to form a top electrode of each of the plurality of capacitors and to form exposed portions of the crystallized dielectric oxide layer;
   selectively removing portions of the crystallized dielectric oxide layer within the exposed portions thereof to form exposed portions of the first electrode layer; and
   selectively removing portions of the first electrode layer within exposed portions thereof to form a bottom electrode of each of the plurality of capacitors;
   wherein an essentially coextensive portion of the high temperature anti-oxidation barrier is simultaneously removed with one of the first and second electrode layers.

13. The method for fabricating a plurality of capacitors according to claim 12, wherein selectively removing portions of the first electrode layer, further comprises forming the bottom electrode beyond the area of the isolated dielectric core to provide an electrical connection to one of a plated via and a plated through hole.

14. The method for fabricating a plurality of capacitors according to claim 12, wherein the portions of the crystallized dielectric oxide layer are selectively removed by one of abrasion and laser scribing.

15. The method for fabricating a plurality of capacitors according to claim 12, wherein selectively removing portions of the crystallized dielectric oxide layer further comprises placing a pattern of material to protect portions of the first electrode layer and the crystallized dielectric oxide layer that are not to be removed.

16. The method for fabricating a plurality of capacitors according to claim 12, wherein selectively removing portions of the first electrode layer and selectively removing portions of the second electrode layer each comprise a photolithographic chemical etching process.

17. The method for fabricating a plurality of capacitors according to claim 12, wherein the crystallized dielectric oxide layer has a capacitance density greater than 2000 pF/mm$^2$.

18. The method for fabricating a plurality of capacitors according to claim 12, wherein the first and second electrode layers each comprise a metal selected from a group consisting of copper, copper alloys, nickel, and nickel alloys.

19. The method for fabricating a plurality of capacitors according to claim 12, wherein the first and second electrodes are each less than 25 microns thick.

20. The method for fabricating a plurality of capacitors according to claim 12, wherein the high temperature anti-oxidation barrier comprises, by weight, more than 50% of one of palladium, platinum, iridium, and nickel or a combination thereof.

21. The method for fabricating a plurality of capacitors according to claim 20, wherein the high temperature anti-oxidation barrier further comprises, by weight, no more than 49% of one or more elements other than palladium, platinum, iridium, and nickel.

22. The method for fabricating a plurality of capacitors according to claim 21, wherein the one or more elements other than palladium, platinum, iridium, and nickel are aluminum, chromium, and phosphorus.

* * * * *